(12) United States Patent
Chadha

(10) Patent No.: US 11,042,098 B2
(45) Date of Patent: Jun. 22, 2021

(54) LARGE AREA HIGH RESOLUTION FEATURE REDUCTION LITHOGRAPHY TECHNIQUE

(71) Applicant: Applied Materials, Inc., Santa Clara, CA (US)

(72) Inventor: Arvinder Chadha, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 153 days.

(21) Appl. No.: 16/276,860

(22) Filed: Feb. 15, 2019

(65) Prior Publication Data
US 2020/0264518 A1    Aug. 20, 2020

(51) Int. Cl.
*G03F 7/213*    (2006.01)
*G03F 7/20*    (2006.01)

(52) U.S. Cl.
CPC .......... *G03F 7/70316* (2013.01); *G03F 7/213* (2013.01); *G03F 7/70275* (2013.01); *G03F 7/70325* (2013.01)

(58) Field of Classification Search
CPC .. G03F 7/70316; G03F 7/213; G03F 7/70275; G03F 7/70325
See application file for complete search history.

(56) References Cited

U.S. PATENT DOCUMENTS 3,615,449 A * 10/1971 Greenaway ........... H01J 29/455
430/312
4,360,586 A * 11/1982 Flanders .............. G02B 5/1857
250/482.1
5,413,884 A    5/1995 Koch et al.
(Continued)

FOREIGN PATENT DOCUMENTS

EP    3251825    * 12/2017
JP    08-179493    *  7/1996
(Continued)

OTHER PUBLICATIONS

Suleski et al., "Fabrication of optical microstructures through fractional Talbot imaging", Proc. SPIE vol. 5720, pp. 86-93 (Jan. 2005).*

(Continued)

*Primary Examiner* — Martin J Angebrannt
(74) *Attorney, Agent, or Firm* — Patterson + Sheridan LLP

(57) ABSTRACT

Embodiments described herein provide a method of large area lithography. One embodiment of the method includes projecting at least one incident beam to a mask in a propagation direction of the at least one incident beam. The mask having at least one period of a dispersive element that diffracts the incident beam into order mode beams having one or more diffraction orders with a highest order N greater than 1. The one or more diffraction orders provide an intensity pattern in a medium between the mask and a substrate having a photoresist layer disposed thereon. The intensity pattern includes a plurality of intensity peaks defined by sub-periodic patterns of the at least one period. The intensity peaks write a plurality of portions in the photoresist layer such that a number of the portions in the photoresist layer corresponding to the at least one period is greater than N.

18 Claims, 6 Drawing Sheets

(56) References Cited

U.S. PATENT DOCUMENTS

| | | | | |
|---|---|---|---|---|
| 6,882,477 | B1* | 4/2005 | Schattenburg | G03F 7/70383 359/35 |
| 2003/0044728 | A1* | 3/2003 | Terada | G03F 7/001 430/321 |
| 2004/0259279 | A1* | 12/2004 | Erchak | H01L 33/20 438/22 |
| 2005/0233262 | A1* | 10/2005 | Luo | G03F 1/38 430/5 |
| 2006/0126053 | A1 | 6/2006 | Hinsberg et al. | |
| 2007/0274633 | A1 | 11/2007 | Raub et al. | |
| 2008/0186579 | A1* | 8/2008 | Solak | G03F 7/22 359/577 |
| 2010/0003605 | A1* | 1/2010 | Gil | G03H 1/02 430/1 |
| 2012/0092635 | A1* | 4/2012 | Solak | G03F 7/7035 355/67 |
| 2013/0344445 | A1* | 12/2013 | Clube | G03F 7/70408 430/322 |
| 2014/0268341 | A1* | 9/2014 | Tam | G02B 5/1876 359/558 |

FOREIGN PATENT DOCUMENTS

| | | | |
|---|---|---|---|
| JP | 11-337713 A | | 12/1999 |
| JP | 2001-066762 | * | 3/2001 |
| JP | 2005-037868 | * | 2/2005 |

OTHER PUBLICATIONS

Zanke et al., "Large-area patterning for photonic crystals via coherent diffraction lithography", J. Vac. Sci.Technol. B., vol. 22(6) pp. 3352-3355 (Nov. 12, 2004).*

Solak et al., "Displacement Talbot lithography: a new method for high resolution patterning of large areas", Opt. Exp., vol. 19(11) pp. 10686-10691 (May 2011).*

Charley et al., "Hyper high numerical aperature interferometer for immersion lithography at 193 nm", J Vac. Sci. Technol., vol. 23(6) pp. 2668-2674 (Nov. 12, 2005).*

Pae et al., "A review of interferometric techniques with possible improvement in pattern resolution using near-field patterning", Proc. SPIE 10449 article 104491B (6 pages) (Jun. 2017).*

Chen, "Plasmonic waveguide lithography for patterning nanostructures with high aspect-ratio and large-area uniformity", Thesis Univ. Mich., (2018) 184 pages.*

Palvanranta et al., "Sub-10nm patterning using EUV interference lithography", Nanotech., vol. 22:375302 (7 pages) (Aug. 2011).*

Brazhnikov et al., "Features of Talbot effect on phase diffraction grating", Proc. SPIE, vol. 10612:106120J (7 pages) (Jan. 2018).*

Isoyan et al., "4X reduction extreme untraviolet interferometric lithography", Opt. Expr., vol. 16(12) pp. 9106-9111 (Jun. 2008).*

Paivanranta et al., "sub-10nm patterning using EUV interference lithography" Nanotech vol. 22 375302 (7pp) (2011).*

Odinokov et al., "The design and manufacturing of diffraction optical elements to form dot-composed etalon image within optical systems", Opt. Photon. J., vol. 2013(1) pp. 102-111 (Mar. 2013).*

Swanson, "Binary Optics Technology: The Theory and Design of multi-level diffractive optical elements", Technical Report 854 (Lincoln Lab., MIT)(AD-A2134040)(Oct. 1989), further in view of Tam et al. 2014/0268341 and/or Terada et al. 20030044728.*

Carla Simone Tafuri Marques, "disribuicao de Especies Luminescentes em Chama Explosivas de C2H2/O2", Univeridade Estadual de Campinas, Instituto de Quimica (1996, Thesis, p. 83 and first page only).*

Chen et al., "A low voltage liquid crystal phase graphing with switchable diffraction angles", Nature Sci. Report., vol. 7 articles 39923 (Jan. 2017).*

Xu et al., "Large-angle and high-efficiency tunable phase grating using field switching liquid crystal", Opt. Express, vol. 23(9) pp. 12274-12285 (Apr. 2015).*

Serrano-Heredia et al., "Measurement of the phase modulation in liquid crystal television based upon the fractional-Talbot effect". Opt. Eng., vol. 36(9) pp. 2680-2684 (Sep. 1996).*

Buchwald, "Fused silica transmission gratings", Ibsen photonics white paper, 22 pages (2007).*

Oriel instruments, "Booklet of grating efficiency curves", 95 pages (pre-1996).*

Erdogan, T., "The grating equation", Plymouth grating laboratory. 6 pages (created Aug. 2018).*

Besold et al., "fractional Talbot effect for periodic microlens arrays", Opt. Eng.,. vol. 36(4) pp. 1099-1104 (Apr. 1997).*

Bourgin et al., "Double sided structured mask for sub-micron resolution proximity i-line mask-aligner lithography"., Opt. Express, vol. 23(13) pp. 16628-16637 (Jun. 2015).*

PCT Notification of Transmittal of the International Search Report and the Written Opinion of the International Searching Authority for International Application No. PCT/US2020/014906; dated Jan. 24, 2020.

* cited by examiner

LARGE AREA HIGH RESOLUTION FEATURE REDUCTION LITHOGRAPHY TECHNIQUE

BACKGROUND

Field

Embodiments of the present disclosure generally relate to lithography. More particularly, embodiments of the present disclosure relate to a method of large area lithography.

Description of the Related Art

Lithography is widely used in the manufacturing of optical components and waveguide structures used in display devices, such as flat panel displays. Large area substrates are often utilized in the manufacture flat panel displays. In one example, flat panel displays are commonly used for active matrix displays, such as computers, touch panel devices, personal digital assistants (PDAs), cell phones, television monitors, and the like.

Conventional lithography of large area substrates includes projecting light beams to a mask. The mask receives the light beams and diffracts the light beams to produce an intensity pattern. Peaks of the intensity pattern write a plurality of portions having sub-micro widths into a photoresist disposed over a substrate positioned under or after the mask. The exposed photo resist can be etched using standard semiconductor processes to transfer a pattern onto a rigid or flexible substrate, thin films or waveguides. The widths of the portions correspond to the critical dimension of the features that enable functionality critical to flat panel displays. However, there are demands and device trends for features having widths not obtainable by conventional lithographic processes.

Accordingly, what is needed in the art are improved methods of lithography that enable large area sub-micron patterning of critical dimensions with high throughput and efficiency at low cost.

SUMMARY

In one embodiment, a method is provided. The method includes projecting at least one incident beam to a mask in a propagation direction of the at least one incident beam. The mask having at least one period of a dispersive element. The at least one period of the dispersive element diffracts the incident beam into order mode beams having one or more diffraction orders with a highest order N greater than 1. The one or more diffraction orders provide an intensity pattern in a medium between the mask and a substrate having a photoresist layer disposed thereon. The intensity pattern includes a plurality of intensity peaks defined by sub-periodic patterns of the at least one period. The intensity peaks of the sub-periodic patterns write a plurality of portions in the photoresist layer such that a number of the portions in the photoresist layer corresponding to the at least one period is greater than N.

In another embodiment, a method is provided. The method includes projecting at least one incident beam to a mask in a propagation direction of the at least one incident beam. The mask has at least one period of a dispersive element is disposed over a reflector. The at least one period of the dispersive element diffracts the incident beam into order mode beams having one or more diffraction orders with a highest order N greater than 1. The reflector reflects the order mode beams to a beam splitter that redirects the one or more diffraction orders. The one or more diffraction orders provide an intensity pattern in a space between the beam splitter and a substrate having a photoresist layer disposed thereon. The intensity pattern includes a plurality of intensity peaks defined by sub-periodic patterns of the at least one period. The intensity peaks of the sub-periodic patterns write a plurality of portions in the photoresist layer such that a number of the portions in the photoresist layer corresponding to the at least one period is greater than N.

In yet another embodiment, a method is provided. The method includes projecting at least one incident beam to a mask in a propagation direction of the at least one incident beam, the mask having at least one period of a dispersive element. The at least one period of the dispersive element diffracts the incident beam into order mode beams having one or more diffraction orders with a highest order N greater than 1. The mask reflects the order mode beams to a beam splitter that redirects the one or more diffraction orders. The one or more diffraction orders provide an intensity pattern in a space between the beam splitter and a substrate having a photoresist layer disposed thereon. The intensity pattern includes a plurality of intensity peaks defined by sub-periodic patterns of the at least one period. The intensity peaks of the sub-periodic patterns write a plurality of portions in the photoresist layer such that a number of the portions in the photoresist layer corresponding to the at least one period is greater than N.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a method of large area lithography to increase a number of portions written into photoresists. One embodiment of the method includes projecting at least one incident beam to a mask in a propagation direction of the at least one incident beam. The mask having at least one period of a dispersive element. The at least one period of the dispersive element diffracts the incident beam into order mode beams having one or more diffraction orders with a highest order N greater than 1. The one or more diffraction orders provide an intensity pattern in a medium between the mask and a substrate having a photoresist layer disposed thereon. The intensity pattern includes a plurality of intensity peaks defined by sub-periodic patterns of the at least one period. The intensity peaks of the sub-periodic patterns write a plurality of portions in the photoresist layer such that a number of the portions in the photoresist layer corresponding to the at least one period is greater than N.

Figure 1A:
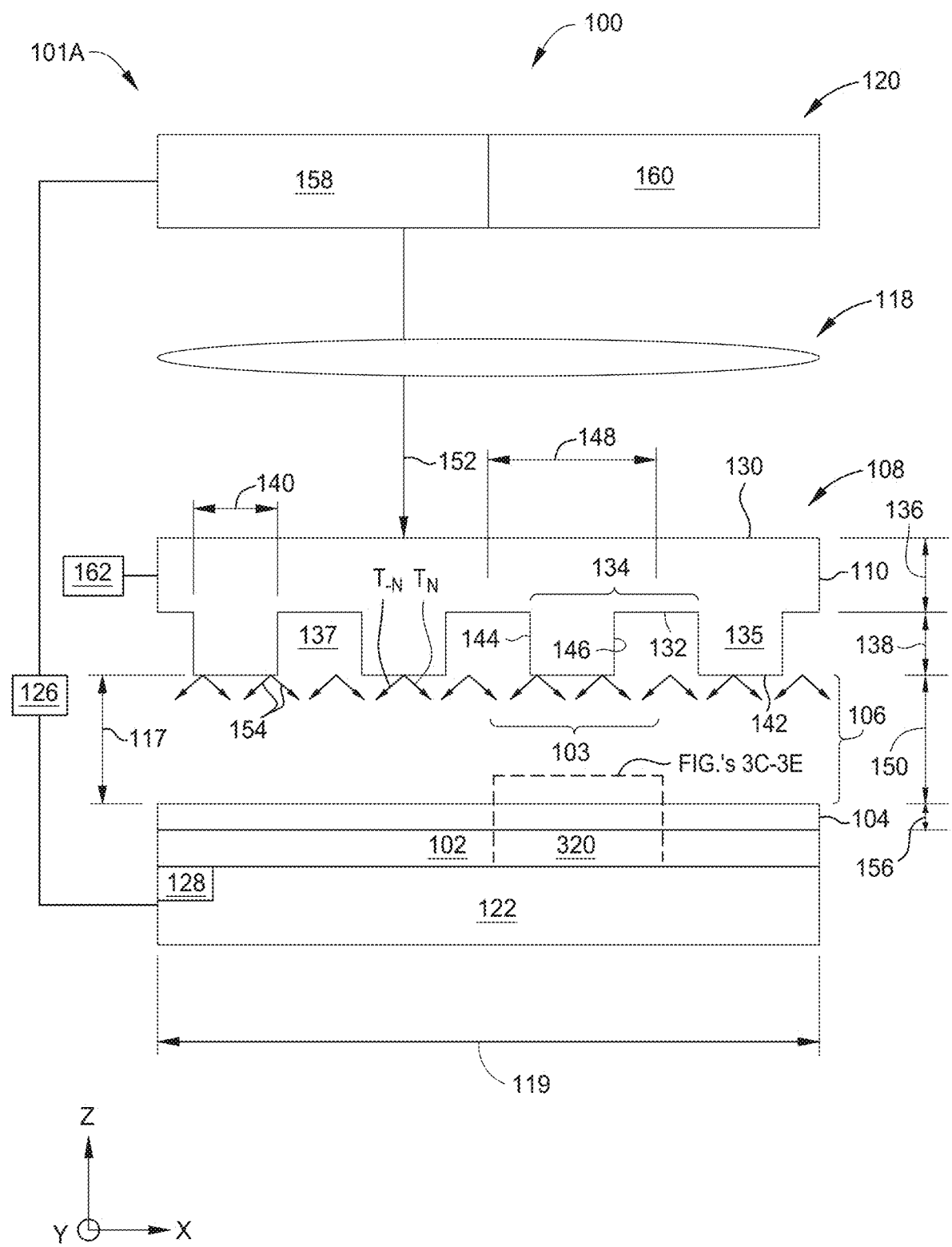
FIG. 1A is a schematic view of a transmission mode configuration of system according to an embodiment.
Figure 1B:
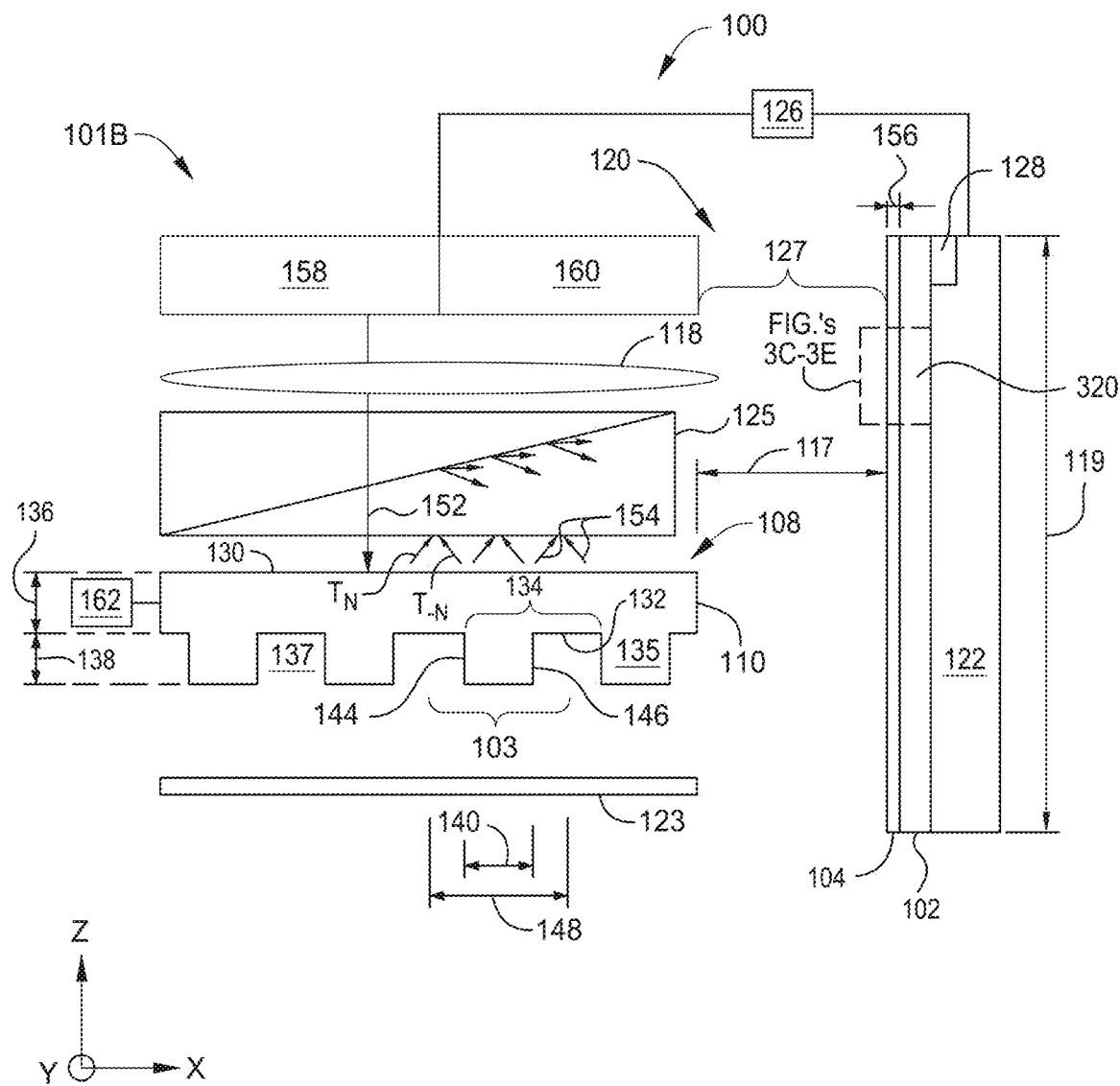
FIG. 1B is a schematic view of a reflection mode configuration of system according to an embodiment.
Figure 1C:
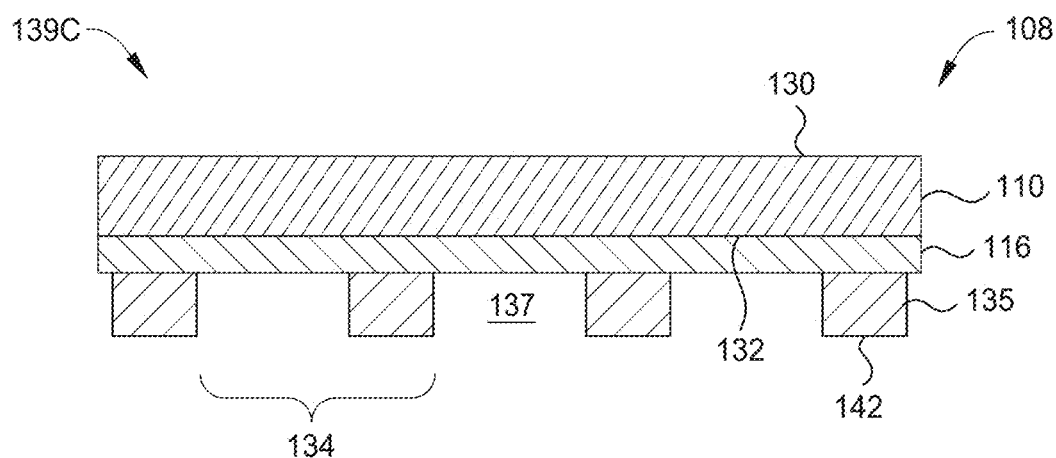
FIGS. 1C-1G are schematic views of a mask according to an embodiment.

FIG. 1A is a schematic view of a transmission mode configuration 101A of system 100, such as a lithography system, that may benefit from embodiments described herein. FIG. 1B is a schematic view of a reflection mode configuration 101B of system 100, such as a lithography system, that may benefit from embodiments described herein. The system 100 includes a stage 122, one or more light sources 120, and a mask 108. A substrate 102 is supported by the stage 122. In one embodiment, which can be combined with other embodiments described herein, the one or more light sources 120 have a projection area smaller than a surface area of the mask 108. The mask 108 is coupled to an actuator 162 configured to move the mask 108 in one or more of an X direction, Y direction and Z direction to position the mask 108 in relation to the one or more light sources 120 and the substrate 102. In another embodiment, which can be combined with other embodiments described herein, the one or more light sources 120 have a projection area smaller than a surface area the substrate 102. The stage 122 of the transmission mode configuration 101A is configured to move in one or more of an X direction, Y direction and Z direction to position the substrate 102 in relation to the one or more light sources 120 and the mask 108. The stage 122 of the reflection mode configuration 101B is configured move in one or more of an X direction, Y direction and Z direction to position the substrate 102 in relation to a beam splitter 125 of the reflection mode configuration 101B described in further detail herein. However, embodiments of the method described herein do not necessitate translational movement of the stage 122 or the mask 108 when the projection area of the one or more light sources 120 is not less than the surface area of the substrate 102 and the surface area of the mask 108.

In one embodiment, which can be combined with other embodiments described herein, the stage 122 of the transmission mode configuration 101A is further configured to tilt so that the substrate 102 is positioned at an angle relative to the x-axis, y-axis, or both the x-axis and y-axis of the mask 108. The stage 122 of the reflection mode configuration 101B is further configured to tilt so that the substrate 102 is positioned at an angle relative to the y-axis, z-axis, or both the y-axis and z-axis of the beam splitter 125. In one embodiment, an encoder 128 is coupled to the stage 122 in order to provide information of the location of the stage 122 to a controller 126. In another embodiment, which can be combined with other embodiments described herein, the encoder 128 includes a photo detector array or a charge coupled device (CCD), such as a CCD camera, that can measure the intensity of the light transmitted from the mask 108. The controller 126 may be coupled to or in communication with the stage 122 and the one or more light sources 120. The controller 126 is generally designed to facilitate the control and automation of the method described herein. The controller 126 may be coupled to or in communication with the stage 122 and the one or more light sources 120. The one or more light sources 120 and the encoder 128 may provide information to the controller 126 regarding substrate processing and substrate aligning. For example, the one or more light sources 120 may provide information to the controller 126 to alert the controller 126 that substrate processing has been completed.

The substrate 102 comprises any suitable material, for example, glass, which is used as part of a flat panel display. In other embodiments, which can be combined with other embodiments described herein, the substrate 102 is made of other materials capable of being used as a part of the flat panel display. For example, the materials include plastic or colorless polyimide. In other embodiments, which can be combined with other embodiments described herein, the substrate 102 is made of other materials capable of being used as a master for large area replication techniques. For example, the materials include glass, plastic with or without thin films of inorganic material and or metal layers on the surface of the substrate 102. The substrate 102 has a film layer to be patterned formed thereon, such as by pattern etching thereof, and a photoresist layer 104 formed on the film layer to be patterned, which is sensitive to electromagnetic radiation, for example UV or deep UV "light". In one embodiment, which can be combined with other embodiments described herein, the photoresist layer 104 is a positive photoresist. A positive photoresist includes portions of the photoresist, when exposed to radiation, that are respectively soluble to a photoresist developer applied to the photoresist after the pattern is written into the photoresist using the electromagnetic radiation. In one embodiment, which can be combined with other embodiments described herein, the photoresist layer 104 is a negative photoresist. A negative photoresist includes portions of the photoresist, when exposed to radiation, that will be respectively insoluble to photoresist developer applied to the photoresist after the pattern is written into the photoresist using the electromagnetic radiation. The chemical composition of the photoresist layer 104 determines whether the photoresist is a positive photoresist or negative photoresist.

Examples of photoresists include, but are not limited to, at least one of diazonaphthoquinone, a phenol formaldehyde resin, poly(methyl methacrylate), poly(methyl glutarimide), and SU-8. After exposure of the photoresist layer 104 to the electromagnetic radiation, the photoresist is developed to leave a patterned photoresist on the underlying film layer. In another embodiment, which can be combined with other embodiments described herein, the photoresist layer 104 is a dual tone photoresist. The dual tone photoresist includes an unexposed region at a low exposure dose and an overexposed region at an excess exposure dose which are not dissolved in the developer, and an exposed region at an intermediate exposure dose which is dissolved in the developer. Then, using the patterned photoresist, the underlying film layer is pattern etched through the openings in the photoresist. In one embodiment, the underlying film layer pattern etched forms optical components, such as a wire grid polarizer or a frequency selective surface, a metamaterials, a flat lens, or portions of the electronic circuitry of the display panel.

Each one or more light source assembly may be mounted at different incident angles relative to the mask 108. Each of the one or more light sources 120 is operable to emit one or more light beams 152, i.e., incident beams. As shown FIG.

1A and FIG. 1B, the one or more light sources 120 include a first light source 158 and a second light source 160. While the first light source 158 and the second light source 160 are shown in FIGS. 1A and 1B, the system 100 may include additional light sources 120. Each light beam 152 has a central wavelength A. In one embodiment, which can be combined with other embodiments described herein, the central wavelength A is about 10 nanometers (nm) to about 632 nm. An emission spectrum of the light source 120 has a fractional bandwidth. The fractional bandwidth is a ratio of the wavelength spread of the central wavelength A expressed as a percentage. In one embodiment, which can be combined with other embodiments described herein, the fractional bandwidth is about 0.001% to about 20%. The central wavelength A includes wavelength-dependent intensity with at a spatial intensity profile. In one embodiment, the light beams 152 are coherent. In another embodiment, the light beams 152 are incoherent. In another embodiment, the light beams 152 are partially coherent. In another embodiment, the spatial intensity profile includes, but is not limited to, one of a uniform profile, top hat profile, triangular profile, trapezoidal profile, exponential, and Gaussian profile. In one embodiment, which can be combined with other embodiments described herein, the one or more light beams 152 are projected from the one or more light sources 120 including a polarizing device, such as a polarizer, to project the one or more light beams 152 as transverse electric (TE) polarized light, transverse magnetic (TM) polarized light, and/or unpolarized light, such as partial polarized light. In one embodiment, which can be combined with other embodiments described herein, each light source of the one or more light sources 120 is coupled to a phase delay driver, such as a random phase delay driver and constant phase delay driver.

In one embodiment, which can be combined with other embodiments described herein, the one or more light sources 120 are broad diode, laser diodes, a phosphor, a photo luminance or an electro luminance from poly dispersed quantum dots (QDs), and/or broad band emitting quantum wells. In another embodiment, which can be combined with other embodiments described herein, the one or more light sources include non-linear materials that enable harmonic, sum, and/or difference frequency generations, materials that enable stoke and anti-stoke shift, and/or pulsars. In yet another embodiment, which can be combined with other embodiments described herein, the one or more light sources produce a plasma discharge distribution and the desired spectrum to be shaped using optical elements. In one embodiment, which can be combined with other embodiments described herein, the one or more light sources 120 may include one or more beam shaping optics 118. In one embodiment, which can be combined with other embodiments described herein, the one or more light sources 120 are coupled to a set of filters to achieve desired spectral content. In one embodiment, which can be combined with other embodiments described herein, each light source of the one or more light sources 120 corresponds of a light beam of the one or more light beams 152. For example, the first light source 158 is operable to emit a first light beam and the second light source 160 is operable to emit a second light beam of the one or more light beams 152.

In one embodiment, which can be combined with other embodiments described herein, each light beam 152 has the fractional bandwidth of about 0.001% to about 20% of the central wavelength A. The emission spectrum of the fractional bandwidth may vary by about 0.01 nm to about 20 nm at a wavelength-dependent intensity. The broadband light source may be a laser diode. Each beam shaping optic of the one or more beam shaping optics 118 includes at least one spectral module and at least one spatial module. In one embodiment, which can be combined with other embodiments described herein, the spectral and spatial module can be integrated in the light source 120. The spectral module filters the broadband light at the emission spectrum to a spectral emission profile. In one embodiment, which can be combined with other embodiments described herein, the spectral emission profile is from about 0.01 nanometers (nm) to about 20 nm. The spatial module filters the intensity spectrum of the light at the spectral emission profile to a spatial intensity profile.

The mask 108 includes a body 110 having a first surface 130 and a second surface 132 with at least one period 103 of a dispersive element 134. The dispersive element 134 includes a feature 135 and a gap 137. In one embodiment, the mask 108 includes two or more dispersive elements 134 disposed on the second surface 132. The gap 137 corresponds to a space between adjacent dispersive elements 134. The period 103, also known as a unit cell, corresponds to a pitch 148. In the embodiments described herein, the pitch 148 includes the feature 135 and half of each gap 137 adjacent to the feature 135. The pitch 148 may also be defined as the distance between first sidewalls 144 of adjacent features 135. The body 108 has a first thickness 136 from the first surface 130 to a second surface 132. Each feature 135 has a height 138 and width 140. The height 138 is from the second surface 132 to a top surface 142 of the feature 135. The width 140 is from the first sidewall 144 to a second sidewall 146 of the feature 135. In one embodiment, which can be combined with other embodiments described herein, the width 140 of at least one feature 135 is different than the width 140 of one or more features 135.

In one embodiment, which can be combined with other embodiments described herein, in the transmission mode configuration 101A, the mask 108 is over the substrate 102. The mask 108 is disposed over the photoresist layer 104 of the substrate 102 with a medium 106 between the mask 108 and the photoresist layer 104. The medium 106 may be air having a refractive index of 1.0 or other materials, such as oil, having a refractive index greater than air. A top surface 142 of each of the dispersive elements 134 may be oriented toward to photoresist layer 104 with a distance 150 between the top surface 142 and the photoresist layer 104. The first surface 130 of the body 110 of the mask 108 may be oriented toward to the photoresist layer 104 with the distance 150 between the first surface 130 and the photoresist layer 104. In another embodiment, which can be combined with other embodiments described herein, in the reflection mode configuration 101B, the mask 108 is over a reflector 123. In one embodiment, which can be combined with other embodiments described herein, the mask 108 is in contact with the reflector 123. In one embodiment, which can be combined with other embodiments described herein, the reflector 123 is absent. The top surface 142 of each of the dispersive elements 134 may be oriented toward the reflector 123. The first surface 130 of the body 110 of the mask 108 may oriented toward the reflector 123.

The body 110 and the dispersive elements 134 of the mask 108 consists of at least one of glass, quartz, chromium (Cr), gold (Au), silver (Ag), aluminum (Al), silicon oxycarbide (SiOC), titanium dioxide ($TiO_2$), silicon dioxide ($SiO_2$), vanadium (IV) oxide ($VO_x$), aluminum oxide ($Al_2O_3$), indium tin oxide (ITO), zinc oxide (ZnO), tantalum pentoxide ($Ta_2O_5$), silicon nitride ($Si_3N_4$), titanium nitride (TiN), and zirconium dioxide ($ZrO_2$) containing materials. The body 110 has a first refractive index and the plurality of dispersive elements 134 has a second refractive index. In one embodiment, which can be combined with other embodiments described herein, the first refractive index and second refractive index are different. For example, the second refractive index may be greater than the first refractive index by the plurality of dispersive elements 134 including a second composition of transparent materials with a greater refractive index than a first composition of transparent materials of the body 110. Additionally, the mask 108 may include multiple layers of the dispersive elements 134.

Figure 1D:
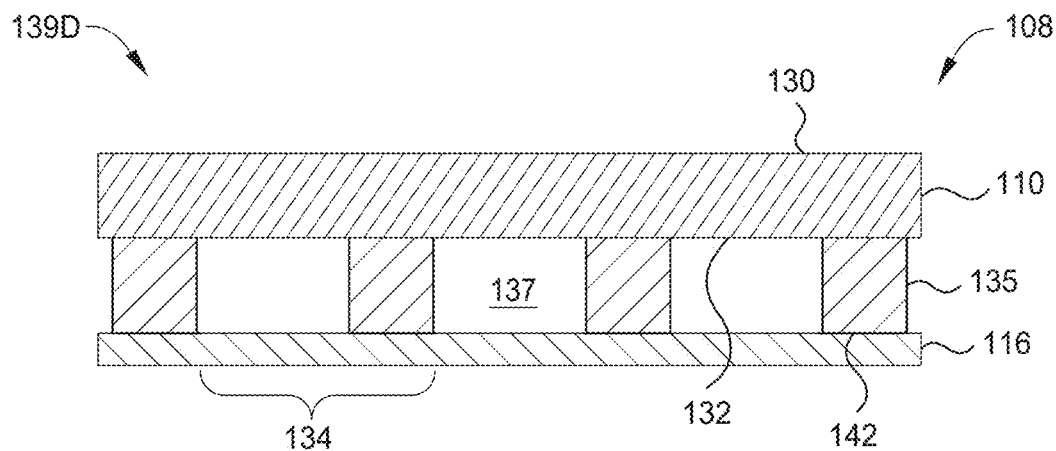
Figure 1E:
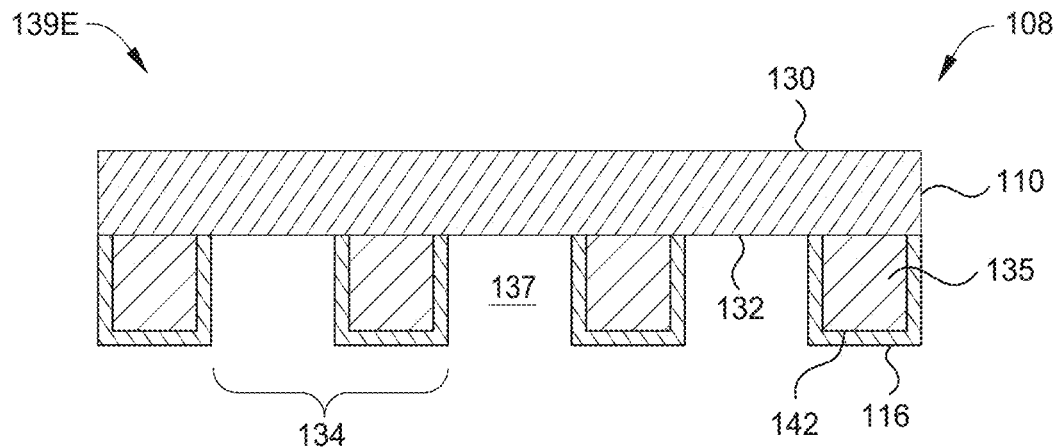
Figure 1F:
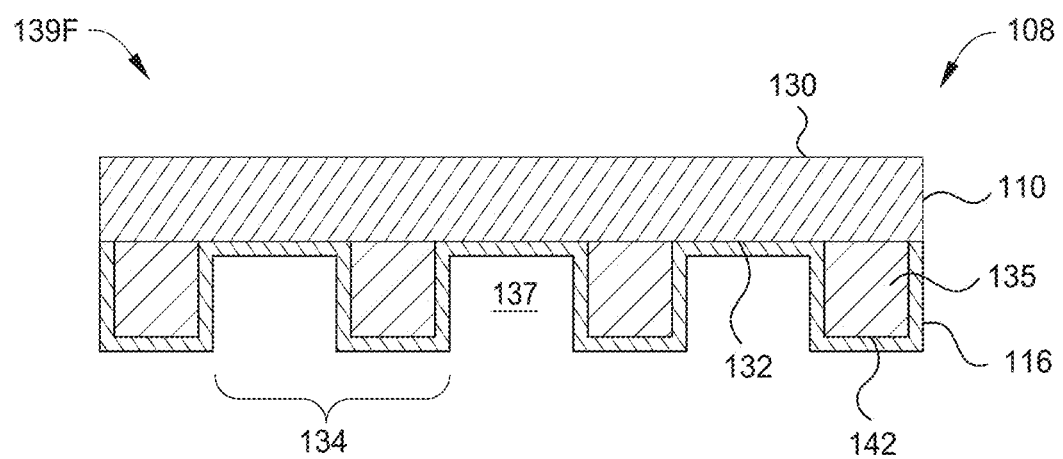
Figure 1G:
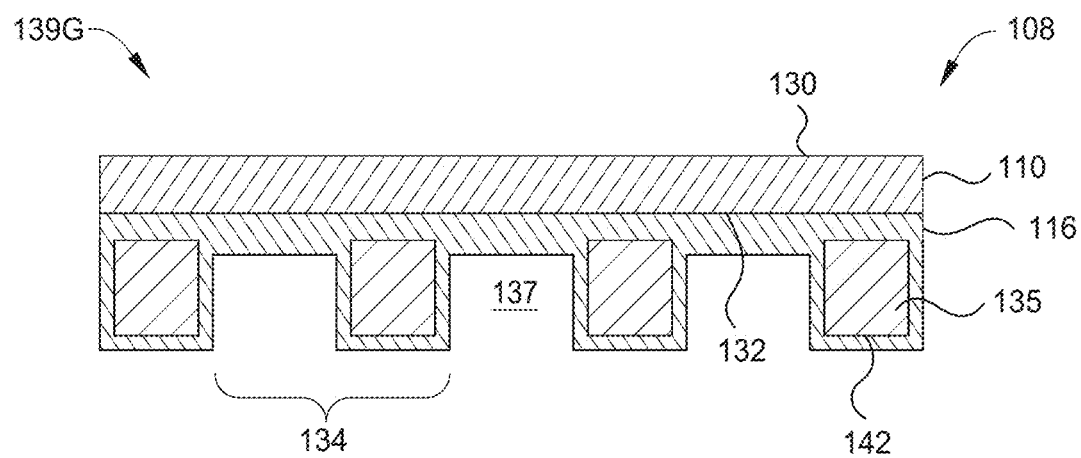

As shown in FIG. 10, a schematic view of an arrangement 139C of the mask 108, a refractive material 116 is disposed on the second surface 132 between the body 110 and the dispersive elements 134. As shown in FIG. 1D, a schematic view of an arrangement 139D of the mask 108, the refractive material 116 is disposed on the top surface 142 of each of the dispersive elements 134. As shown in FIG. 1E, a schematic view of an arrangement 139E of the mask 108, each of the dispersive elements 134 is coated with the refractive material 116. As shown in FIG. 1F, a schematic view of an arrangement 139F of the mask 108, each of the dispersive elements 134 and the exposed second surface 132 is conformal coated with the refractive material 116. As shown in FIG. 1G, a schematic view of an arrangement 139G of the mask 108, each of the dispersive elements 134 is coated with the refractive material 116 and the refractive material 116 is disposed on the second surface 132 between the body 110 and the dispersive elements 134. The refractive material 116 has a third refractive index. In one embodiment, which can be combined with other embodiments described herein, the third refractive index different than the first refractive index of the body 110 and the second refractive index of the plurality of dispersive elements 134. In another embodiment, which can be combined with other embodiments described herein, the third refractive index is the same as the first refractive index of the body 110. The mask 108 may include one or more of the arrangements 139C, 139D, 139E, 139F, 139G. In one embodiment, which can be combined with other embodiments described herein, each of the dispersive elements 134 may be a periodic in at least one of one, two, and three dimensions, quasi periodic, or aperiodic. In one embodiment, which can be combined with other embodiments described herein, each of the dispersive elements 134 has features 135 with rectangular, pyramidal, cylindrical, circular, triangular, and blazed cross sections. In another embodiment, which can be combined with other embodiments described herein, features 135 are not limited to rectangular, pyramidal, cylindrical, circular, triangular, and blazed cross sections. In yet another embodiment, which can be combined with other embodiments described herein, each of the dispersive elements 134 correspond at least one of a wire grid polarizer, a photonic crystal, a polarization splitter, an optical buffer, a metamaterial, a flat lens, and a frequency selective filter.

Figure 2:
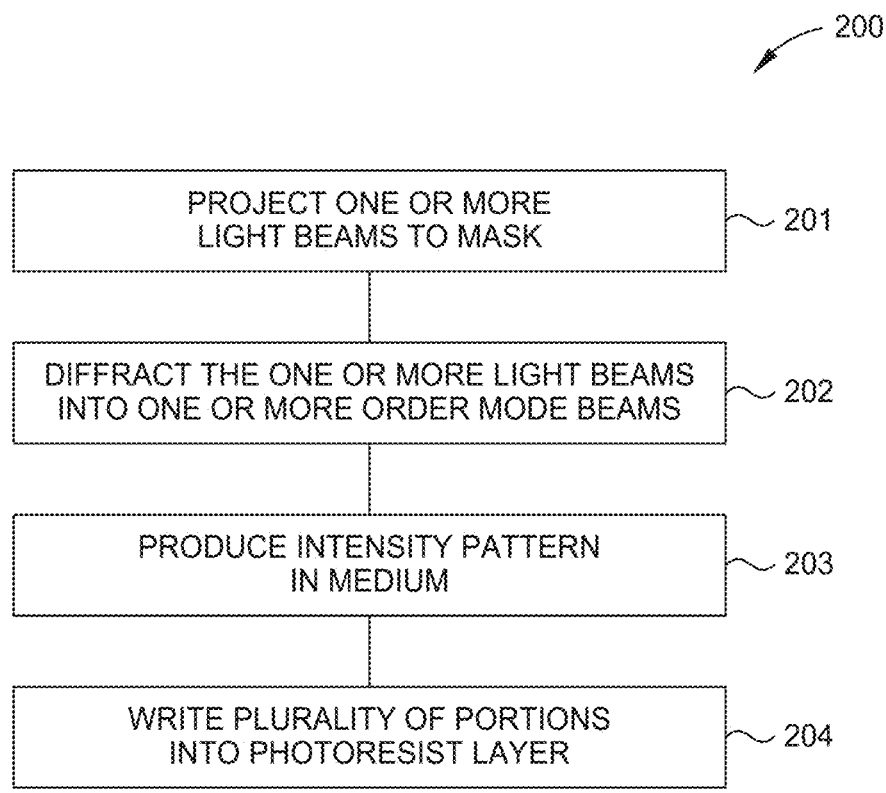
FIG. 2 is a flow diagram of a method of large area lithography according to an embodiment.

FIG. 2 is a flow diagram of a method 200 of large area lithography. In one embodiment, which can be combined with other embodiments described herein, system 100 is utilized for the method 200. It is to be understood that the system is an exemplary system and other systems, including systems from other manufacturers, may be used with or modified to accomplish aspects of the present disclosure. At operation 201, one or more light beams 152 are projected to a mask 108. Each light beam 152 has a central wavelength $\lambda$. In one embodiment, which can be combined with other embodiments described herein, the one or more light beams 152 have the same central wavelength $\lambda$, the same polarization, and the same incidence angle $\Theta$ requiring the photoresist layer 104 to have a substantial thickness 156. In another embodiment, which can be combined with other embodiments described herein, at least one light beam of the one or more light beams 152 has at least one of a different central wavelength $\lambda$, a different polarization, a different incidence angle $\Theta$.

At operation 202, at least one period 103 of a dispersive element 134 of the mask 108 receives the one or more light beams 152 and diffracts the light beams 152 into one or more order modes beams 154. The one or more order modes beams 154 have one or more diffraction orders n with a highest order N greater than 1. In one embodiment, which can be combined with other embodiments described herein, one or more order mode beams 154 includes one or more diffraction orders n with the highest order N and a negative highest order −N and without diffraction orders m, of the one or more diffraction orders n, between the highest order N and the negative highest order −N. In one example, a highest order N mode ($T_N$) beam diffracted is a second-order mode ($T_2$) beam and a negative highest order −N mode ($T_{-N}$) beam diffracted is a negative second-order mode ($T_{-2}$) beam. A zero-order mode ($T_0$) beam, a first-order mode ($T_1$) beam, and a negative first-order mode ($T_{-1}$) beam, i.e., diffraction orders m, have minimal diffracted power. In another example, the highest order N mode ($T_N$) beam diffracted is a third-order mode ($T_3$) beam and the negative highest order −N mode ($T_{-N}$) beam diffracted is a negative third-order mode ($T_{-3}$) beam. The $T_0$ beam, the $T_1$ beam, the $T_{-1}$ beam, the $T_2$ beam, and $T_{-2}$ beam, i.e., diffraction orders m, have minimal diffracted power. In yet another example, the diffraction orders m have the diffracted power less than the diffracted power of each of the $T_N$ beam and the $T_{-N}$ beam. In yet another embodiment, $T_0$ beam, the $T_1$ beam, the $T_{-1}$ beam, the $T_N$ beam, and $T_{-N}$ beam have the diffracted power less than the diffracted power of each of the $T_2$ beam and the $T_{-2}$ beam. The height 138, the width 140, cross section of the features 135, a pitch 148, and refractive index modulation, for example include one or more of the arrangements 139C, 139D, 139E, 139F, 139G, are controlled to distribute power in the diffracted order. An optimal refractive index modulation, dimensional design and morphological of the mask bearing features may maximize the diffracted power in the highest positive N order and negative order −N with minimal diffracted powers in diffraction orders m of the one or more diffraction orders n.

Figure 3A:
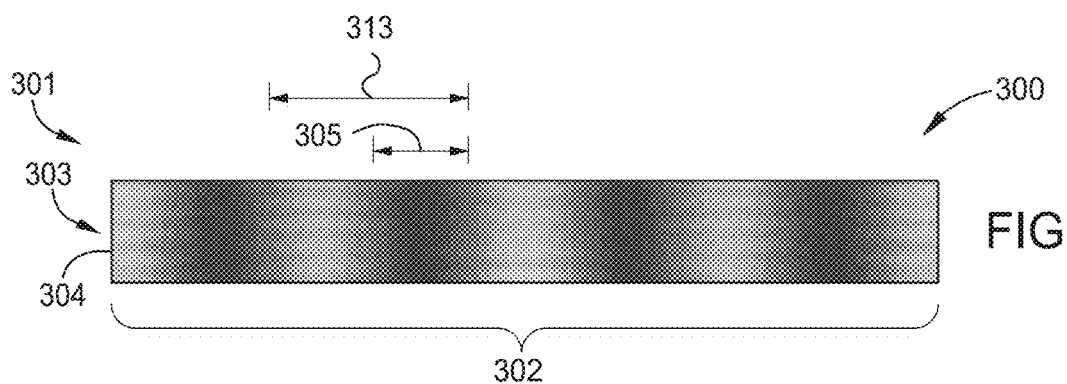
FIG. 3A illustrates a period of an intensity pattern according to an embodiment.

At operation 203, the one or more order diffraction orders n produce an intensity pattern 301 (shown in FIG. 3A). In the transmission mode configuration 101A, the intensity pattern 301 is in the medium 106. In one embodiment of the reflection mode configuration 101B, which can be combined with other embodiments described herein, the reflector 123 reflects the one or more order more diffraction orders n to the beam splitter 125. In another embodiment of the reflection mode configuration 101B without the reflector 123, which can be combined with other embodiments described herein, the diffractive elements reflects the one or more order more diffraction orders n to the beam splitter 125. The beam splitter 125 redirects the one or more order diffraction orders n and produces the intensity pattern 301 in a space 127 between the beam splitter 125 and the photoresist layer 104. The intensity pattern 301 includes a plurality of intensity peaks 303 repeated periodically in a propagation distance 117. The intensity pattern 301 is repeated periodically in a traverse distance 119 across the photoresist layer 104. FIG. 3A illustrates a lateral pattern 300 of the intensity pattern 301. The lateral pattern 300 corresponds to one period 103.

The lateral pattern 300 is repeated periodically in a traverse distance 302 across the length of the photoresist layer 104. The intensity pattern 301 includes a plurality of intensity peaks 303 defined by sub-periodic patterns 313 of the at least period 103. Each of the sub-periodic patterns 313 correspond to a region 305 between adjacent intensity peaks 303 and one of intensity peaks 303. The plurality of intensity peaks 303 is repeated periodically in a propagation distance. FIG. 3A illustrates is a portion 307 of the propagation distance. In one embodiment, in the propagation distance from the mask 108 to the photoresist layer 104, the plurality of intensity peaks 303 are repeated by a plane 304. In another embodiment, in the propagation distance from the beam splitter 125 to the photoresist layer 104, the plurality of intensity peaks 303 the plurality of intensity peaks 303 are repeated by the plane 304. The plane 304 is repeated with a spacing of $\lambda/\sqrt{(1-(1-(\lambda^2/d^2))}$ for monochromatic light along the propagation direction of the transmitted light. The plane 304 is also known as a Talbot plane. The intensity peaks 303 are displaced by one half period with respect to each other at odd and even multiples of Talbot planes. For polychromatic light, the plane 304 is a resultant from the interference of individual wavelengths in which an image independent of the light propagation direction can be observed. The images independent of the light propagation direction tend to have spatial frequency greater than mask 108 and repeat with a spacing of about $(d^2\Delta\lambda)/\lambda^2$, where $\lambda$ is the central wavelength $\lambda$ of the light beams 152, $\Delta\lambda$ is the difference in the minimum and maximum of the light beams 152, and d is the period 103.

Referring to FIG. 2, at operation 204, each intensity peak of the plurality of intensity peaks 303 that contacts the photoresist layer 104 writes a portion of a plurality of portions (shown in FIGS. 3C-3E) into the photoresist layer 104. Prior to exposure of the resist, the intensity can be mapped using the photo detector. In one embodiment, which can be combined with other embodiments described herein, the photoresist layer 104 includes at least one of at least one of ZEP, polymethyl methacrylate (PMMA), PI, and AZ resist materials. In one embodiment, which can be combined with other embodiments described herein, a bottom anti-reflective coating (BARO) disposed over the substrate 102. A hard mask layer may be disposed on the substrate 102. The hard mask layer includes, but is not limited to, resists, metals, oxides, and nitrides, and combinations thereof. Examples of hard mask materials include Cr, SiOC, TiO$_2$, SiO$_2$, VO$_x$, Al$_2$O$_3$, ITO, ZnO, Ta$_2$O$_5$, Si$_3$N$_4$, TiN, tungsten nitride (WN), and ZrO$_2$ materials.

Figure 3B:
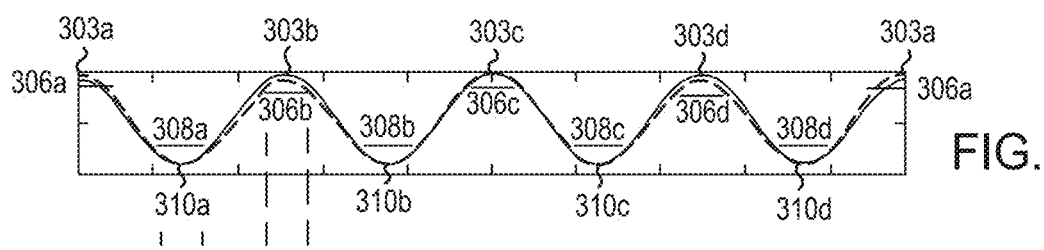
FIG. 3B illustrates a normalized line intensity of a plane of a lateral pattern of an intensity pattern according to an embodiment.
Figure 3C:
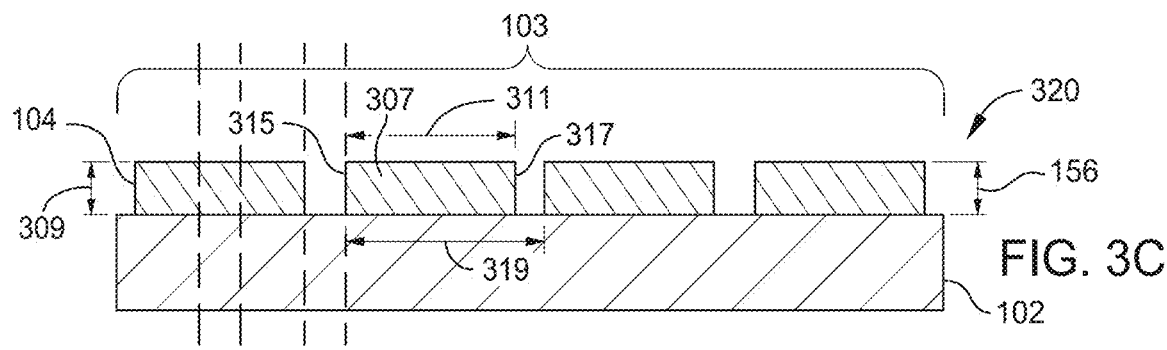
FIGS. 3C-3E illustrate a segment of a substrate corresponding to one period of a mask according to an embodiment.
Figure 3D:
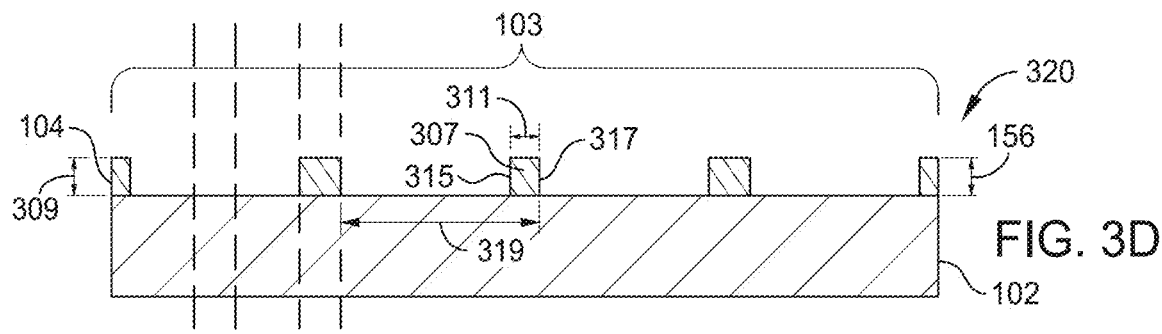
Figure 3E:
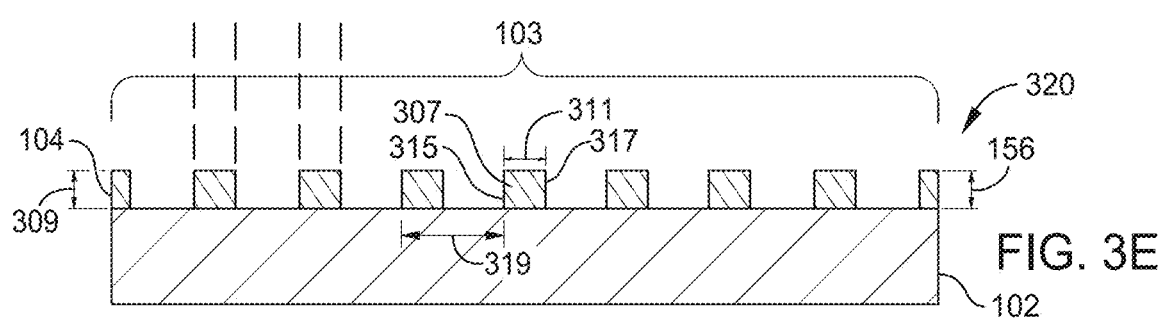

FIG. 3B illustrates a normalized line intensity of the plane 304 of the lateral pattern 300 of the intensity pattern 301. FIG. 3B shows a spatially integrated normalized electric field intensity distribution of thicknesses of 250 nm, 500 nm, 750 nm, and 1000 nm corresponding to examples of photoresist thicknesses for lithography applications. FIG. 3C illustrates a segment 320 of the substrate 102, with a positive photoresist, corresponding to one period 103 of the mask 108. FIG. 3D illustrates the segment 320 of the substrate 102, with a negative photoresist, corresponding to one period 103 of the mask 108. FIG. 3E illustrates the segment 320 of the substrate 102, with a dual tone photoresist, corresponding to one period 103 of the mask 108. In one embodiment, which can be combined with other embodiments described herein, one of the planes 304 is located at about 100 micrometers (μm). The plane 304 includes the one or more intensity peaks 303, e.g., 303a, 303b, 303c, and 303d. Each of the intensity peaks 303a, 303b, 303c, 303d has a corresponding width 306, e.g., 306a, 306b, 306c, and 306d. The widths 306a, 306b, 306c, 306d may be the same or at least one width 306 may be different. The intensity pattern 301 includes the one or more intensity minimums 310, e.g., 310a, 310b, 310c, and 310d. Each of the intensity minimums 310a, 310b, 310c, 310d has a corresponding width 308, e.g., 308a, 308b, 308c, and 308d. The widths 308a, 308b, 308c, 308d may be the same or at least one width 308 may be different. The at least one light beam of the one or more light beams 152 having at least one of a different central wavelength $\lambda$, a different polarization, a different incidence angle $\Theta$ increases the contrast ratio of the intensity peaks 303 and intensity minimums 310. Each portion of the plurality of portions 307 has a height 309, a width 311, and a sub-periodic pattern 319. The height 309 corresponds to a thickness 156 of the photoresist layer 104. The width 311 is a distance between a first edge 315 and a second edge 317 of the portion. The sub-periodic pattern 313 is a distance between adjacent first edges 315. In one embodiment, which can be combined with other embodiments described herein, the width 311 of at least one portion of the plurality of portions 307 is different within one period 103. In another embodiment, which can be combined with other embodiments described herein, the width 311 of each portion of the plurality of portions 307 is the same within one period 103.

As shown in FIG. 3C and FIG. 3D, the intensity peak 303 corresponds to the width 311 of a portion of the plurality of portions 307. In the embodiments of the positive photoresist, as shown in FIG. 3C, the width 311 is a distance between adjacent intensity peaks 303, for example, the intensity peak 303b and the intensity peak 303c. In the embodiments of the negative photoresist, as shown in FIG. 3D, the width 311 each of the portions 307 of the segment 320 is defined by the widths 306a, 306b, 306c, 306d. Each sub-periodic pattern 319 of the portion of the plurality of portions 307 of the embodiments of FIG. 3C and FIG. 3D corresponds to the region 305 between adjacent intensity peaks 303 and one of intensity peaks 303. In the embodiments of the dual tone photoresist, as shown in FIG. 3E, the width 311 of each of the portions 307 of the segment 320 is defined by the widths 306a, 306b, 306c, 306d and the widths 308a, 308b, 308c, 308d. Each sub-periodic pattern 319 of the portion of the plurality of portions 307 of the embodiments of FIG. 3E corresponds to a distance between adjacent first edges 315. In one embodiment, which can be combined with other embodiments described herein, at least sub-periodic pattern 319 is different within one period 103. In another embodiment, which can be combined with other embodiments described herein, each sub-periodic pattern 319 is the same within one period 103.

To write the plurality of portions 307 in the photoresist layer 104 such that a number of the portions 307 in the photoresist layer 104 corresponding to the at least one period 103 is greater than N, the one or more order modes beams 154 have one or more diffraction orders n with a highest order N greater than 1. The ratio of periods 103 to portions 307 is about 1:N to about 1:N$^2$. In embodiments with one or more diffraction orders n with the highest order N and a negative highest order −N, and without diffraction orders between the highest order N and the negative highest order −N of the one or more diffraction orders, the number of the portions 307 in the photoresist layer 104 corresponding to the at least one period 103 is about N$^2$. The ratio of periods 103 to portions 307 is 1:N$^2$. In embodiments with utilizing the dual tone photoresist, the number of the portions 307 in the photoresist layer 104 corresponding to the at least one period 103 is about 1:2N to about 1:2N$^2$.

In summation, a method of large area lithography to increase a number of portions written into photoresists is described herein. The method of lithography enables large area sub-micron patterning of critical dimensions with high throughput and efficiency at low cost. To write the plurality of portions in the photoresist layer such that a number of the portions in the photoresist layer corresponding to the at least one period is greater than N, the one or more order modes beams have one or more diffraction orders with a highest order N greater than 1. The ratio of periods to portions is 1:N. Diffracting one or more diffraction orders with the highest order N and a negative highest order −N, results in about N to about $N^2$ portions in the photoresist layer 104 corresponding to the at least one period 103. The ratio of periodic patterns to portions is about 1:N to about 1:$N^2$.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
    projecting at least one incident beam to a mask in a propagation direction of the at least one incident beam, the mask having at least one period of a dispersive element, wherein:
        the at least one period of the dispersive element of the mask diffracts the incident beam into a plurality of order mode beams having diffraction-orders, the diffraction orders of the order mode beams having a total of:
            a highest order N greater than 1;
            a negative highest order −N less than −1; and
            order modes m between −N and N, the highest order N and negative highest order −N of the order mode beams each include a greater diffracted power than each of order mode beams with the orders m;
        the diffraction orders provide an intensity pattern in a medium between the mask and a substrate, the order mode beams in the medium including the highest order N, the negative highest order −N, and each of the order modes m, the substrate having a photoresist layer disposed thereon;
        the intensity pattern includes a plurality of intensity peaks defined by sub-periodic patterns of the at least one period; and
        the intensity peaks of the sub-periodic patterns write a plurality of portions in the photoresist layer such that a number of the portions in the photoresist layer corresponding to the at least one period is greater than N.

2. The method of claim 1, wherein:
    the dispersive element is periodic in at least one of one, two, and three dimensions, quasi periodic, and aperiodic; and
    the dispersive element has a feature with one of a rectangular, circular, triangular, and blazed cross section.

3. The method of claim 2, wherein a body of the mask has a first refractive index and the dispersive element has a second refractive index different than the first refractive index.

4. The method of claim 3, wherein a refractive material is disposed on a top surface of the dispersive element.

5. The method of claim 3, wherein a refractive material is disposed between a surface of the body and the dispersive element.

6. The method of claim 1, wherein the number of the portions in the photoresist layer corresponding to the at least one period is about N to about $N^2$.

7. The method of claim 1, wherein the dispersive element corresponds to at least one of a wire grid polarizer, a photonic crystal, an optical buffer, polarization splitter, a metamaterial, a flat lens, and a frequency selective filter.

8. The method of claim 1, wherein the photoresist layer is a dual tone photoresist and the number of the portions in the photoresist layer corresponding to the at least one period is about 2N to about $2N^2$.

9. The method of claim 1, wherein the mask comprises at least one of glass, quartz, chromium (Cr), gold (Au), silver (Ag), aluminum (Al), silicon oxycarbide (SiOC), titanium dioxide ($TiO_2$), silicon dioxide ($SiO_2$), vanadium (IV) oxide ($VO_x$), aluminum oxide ($Al_2O_3$), indium tin oxide (ITO), zinc oxide (ZnO), tantalum pentoxide ($Ta_2O_5$), silicon nitride ($S_{i3}N_4$), titanium nitride (TiN), and zirconium dioxide ($ZrO_2$) containing materials.

10. The method of claim 1, wherein the number of the portions in the photoresist layer corresponding to the at least one period is between about N to about $N^2$.

11. A method, comprising:
    projecting at least one incident beam to a mask in a propagation direction of the at least one incident beam, the mask having at least one period of a dispersive element is disposed over a reflector, wherein:
        the at least one period of the dispersive element of the mask diffracts the incident beam into a plurality of order mode beams having diffraction orders, the diffraction orders of the order mode beams having a total of:
            a highest order N greater than 1;
            a negative highest order −N less than −1; and
            order modes m between −N and N, the highest order N and negative highest order −N of the order mode beams each include a greater diffracted power than each of order mode beams with the orders m;
        the reflector reflects the order mode beams to a beam splitter that redirects the diffraction orders;
        the diffraction orders provide an intensity pattern in a space between the beam splitter and a substrate, the order mode beams in the space including the highest order N, the negative highest order −N, and each of the order modes m, the substrate having a photoresist layer disposed thereon;
        the intensity pattern includes a plurality of intensity peaks defined by sub-periodic patterns of the at least one period; and
        the intensity peaks of the sub-periodic patterns write a plurality of portions in the photoresist layer such that a number of the portions in the photoresist layer corresponding to the at least one period is greater than N.

12. The method of claim 11, wherein:
    the dispersive element is periodic in at least one of one, two, and three dimensions, quasi periodic, and aperiodic; and
    the dispersive element has a feature with one of a rectangular, circular, triangular, and blazed cross section.

13. The method of claim 12, wherein a body of the mask has a first refractive index and the dispersive element has a second refractive index different than the first refractive index.

14. The method of claim 13, wherein a refractive material is disposed on a top surface of the dispersive element.

15. The method of claim 13, wherein a refractive material is disposed between a surface of the body and the dispersive element.

16. The method of claim 11, wherein the dispersive element corresponds to at least one of a wire grid polarizer, a photonic crystal, a polarization splitter, an optical buffer, a metamaterial, a flat lens, and a frequency selective filter.

17. The method of claim 11, wherein the photoresist layer is a dual tone photoresist and the number of the portions in the photoresist layer corresponding to the at least one period is about 2N to about $2N^2$.

18. A method, comprising:
projecting at least one incident beam to a mask in a propagation direction of the at least one incident beam, the mask having at least one period of a dispersive element, wherein:
the at least one period of the dispersive element of the mask diffracts the incident beam into a plurality of order mode beams having diffraction orders, the diffraction orders of the order mode beams having a total of:
a highest order N greater than 1;
a negative highest order −N less than −1; and
order modes m between N and N, the highest order N and negative highest order −N of the order mode beams each include a greater diffracted power than each of order mode beams with the orders m;
the mask reflects the order mode beams to a beam splitter that redirects the diffraction orders;
the diffraction orders provide an intensity pattern in a space between the beam splitter and a substrate, the order mode beams in the space including the highest order N, the negative highest order −N, and each of the order modes m, the substrate having a photoresist layer disposed thereon;
the intensity pattern includes a plurality of intensity peaks defined by sub-periodic patterns of the at least one period; and
the intensity peaks of the sub-periodic patterns write a plurality of portions in the photoresist layer such that a number of the portions in the photoresist layer corresponding to the at least one period is greater than N.

* * * * *